United States Patent [19]

McGregor et al.

[11] Patent Number: 4,766,568
[45] Date of Patent: Aug. 23, 1988

[54] GENERIC ASSOCIATIVE MEMORY

[75] Inventors: Douglas R. McGregor; Jon R. Malone, both of Glasgow, Scotland

[73] Assignee: University of Strathclyde, United Kingdom

[21] Appl. No.: 915,920

[22] Filed: Oct. 6, 1986

Related U.S. Application Data

[63] Continuation of Ser. No. 789,919, Oct. 18, 1985, abandoned, which is a continuation of Ser. No. 454,333, Dec. 29, 1982, abandoned.

[51] Int. Cl.$^4$ .............................................. G11C 15/00
[52] U.S. Cl. .................................... 365/49; 365/175; 340/825.96
[58] Field of Search ................. 365/49, 105, 175, 189; 340/825.83, 825.84, 825.85, 825.86, 825.87, 825.88, 825.89, 825.90, 825.96; 364/200 MS File, 900 MS File; 307/465

[56] References Cited

U.S. PATENT DOCUMENTS

| | | | |
|---|---|---|---|
| 3,245,051 | 4/1966 | Robb | 365/105 |
| 3,245,052 | 4/1966 | Lewin | 365/49 |
| 3,321,745 | 5/1967 | Mansuetto et al. | 340/825.86 |
| 4,038,638 | 7/1977 | Hwang | 340/825.89 |
| 4,151,374 | 4/1979 | Fukuhara et al. | 340/825.94 |
| 4,162,538 | 7/1979 | Thornburg | 365/103 |

FOREIGN PATENT DOCUMENTS 0086646 8/1983 European Pat. Off. ........ 340/825.87

OTHER PUBLICATIONS

Enger, "Extended Associative Read Only Store Match Array", IBM Tech. Disc. Bulletin, vol. 14, No. 7, Dec. 1971, p. 1960.

Primary Examiner—Stuart N. Hecker
Assistant Examiner—Glenn A. Gossage
Attorney, Agent, or Firm—Mason, Fenwick & Lawrence

[57] ABSTRACT

A computer memory device (10) for storing identified associations between data items of a data collection comprises an array (15) of signal flow pathways (1,2,3 etc) which are respectively rendered representative of data items by an indexing component (12) and input/output circuitry (18) connected to the array (15). Controllable interconnect elements (A,B,C,D,E, etc) selectively interconnect the pathways (1,2,3 etc) in one or more pairs and effect directional control of signal flow between each interconnected pair in accordance with the identified association between the respectively represented data items of the data collection. The interconnect elements (A,B,C etc) are status controlled by signals delivered thereto over respective channels (20A,20B,20C etc) from respective control devices (22A,22B,22C etc) which are contained in a memory (17) which is externally addressable by component (11). The memory (17) may be a conventional random access memory having bi-state memory locations or it may have tri-state memory locations. The interconnect elements (A,B,C etc) are each multi-state, having preferably four states of which one is disconnect. A plurality of devices (10) can be interconnected to increase memory capacity by external permanent connections of only a few of the signal pathways.

7 Claims, 8 Drawing Sheets

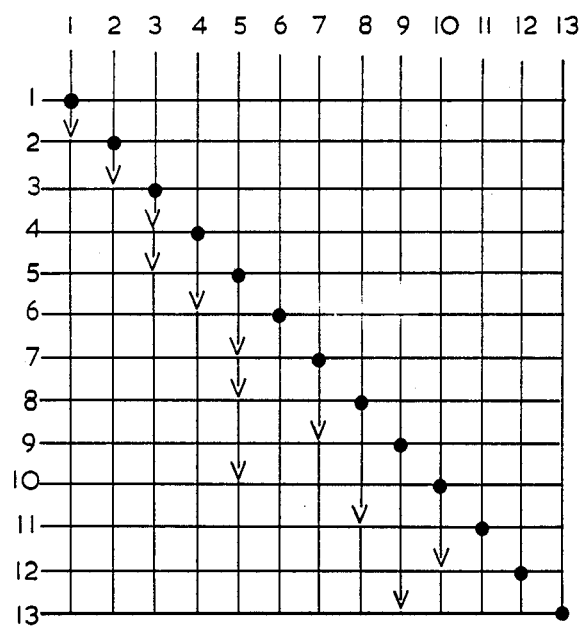
Key:
V (diode) switched connection
●— (wired) permanent connection
read V as 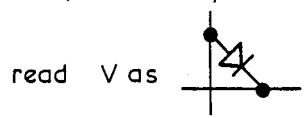
FIG. 4

Full interconnection of 4 X 4-by-4
to give equivalent of 1 X 8-by-8

Key:
○ — diode
● — connector

GENERIC ASSOCIATIVE MEMORY

This application is a continuation of application Ser. No. 789,919, filed Oct. 18, 1985, now abandoned, which is a continuation of application Ser. No. 454,333, filed Dec. 29, 1982, now abandoned.

This invention relates to computer memory devices.

Computer memory devices are conventionally provided to store information which is capable of being retrieved on demand. Conventionally, the information comprises large data collections, only some items of which are sought to be retrieved at any particular demand. The problem with conventionally-organised computer memory devices is the relatively long time taken to identify the items of interest from the complete data collection at each demand. Furthermore, in many large data collections, items are indexed as forming a member of one or more sets, and data retrieval from the large collection is effected by the operator, or user, demanding retrieval of all data items forming one, or more, sets. Retrieval of all items of interest is, therefore, dependent upon correct allocation of each item to every possible relevant set in the initial indexing, and is also dependent upon the user correctly identifying all possible sets of interest at each demand. In practice, incomplete data recall results.

In principle, the latter problem can be overcome by storing a thesaurus of sets which is used initially when entering a data item for storage, so that the item is correctly indexed under every possible relevant set, and, secondly, is used at each particular demand to identify every possible relevant set from which to retrieve data items. However, in practice, such an arrangement would be considered wholly uneconomic due to the exceedingly large data storage volume required. This arises because in even the simplest data collections, there exist many associations between the data items, so that the number of sets which can be identified within the data collection is correspondingly large.

By way of illustration, FIG. 1 shows a very simple data collection with the data items arranged in set order so as to identify the associations and interrelationships between data items.

The data collection consists of the data items: object, animate object, person, employee, salesman, Anderson, schoolteacher, David Green, Lecturer, chemistry lecturer, Fred Jones, school-boy, J. R. Smith; and, by way of example the set for 'Lecturer' consists of 'chemistry lecturer' and 'Fred Jones'. However, 'Lecturer' is a member of the set of 'employee' and in turn 'employee' is a member of the set of 'person', etc.

The problem is to provide a memory device in which the various items of the data collection can be stored and, which, in response to the query to identify all 'Lecturers' will recall 'chemistry lecturer' and 'Fred Jones' and at the same time can identify that 'Lecturer' is a member of the sets of 'employee', 'person', 'animate object', and 'object', so that the user can, if necessary, redirect his enquiry to recall all members of the set of 'employee', etc.

Although the foregoing description refers to sets of data items this is not the only natural form of association between data items found in data collections. For example, data items may have a causal relationship, which is a different form of association.

According to the present invention there is provided a computer memory device for storing identified associations between data items of a data collection, said device comprising an array of signal-flow pathways, which pathways are respectively representative of data items of said data collection, controllable interconnect means for selectively interconnecting said pathways in one or more pairs and effecting directional control of signal flow between each interconnected pair in accordance with the identified associations between the respectively represented data items of said data collection, and signal input/output means connected to said array for delivering an input signal to a selected pathway representative of a selected data item and for receiving output signals from the pathways interconnected therewith and representative of the data items of said data collection which have identified associations with said selected data item.

Preferably, each pathway of said array is interconnectable with each other pathway by means of a said controllable interconnect means. It will, therefore, be appreciated that, merely because a pair of pathways are interconnected, this does not mean that each pathway of the pair cannot also be interconnected with one or more other pathways in order to form various other 'pairs' of interconnected pathways.

Preferably, each controllable interconnect means is operable selectively to effect control of signal flow between interconnected pathways, either unidirectionally in one of two opposed directions, or bidirectionally.

It will be understood that the status of a controllable interconnect means effectively represents the identified association between the two data items represented by the two pertaining signal flow pathways, so that if the interconnect means is controlled to prevent interconnection between the pathways this is representative of an absence of association between the pertaining data items; bidirectional interconnection is representative of the data items being aliases (or synonyms) and unidirectional interconnection is representative of one data item being, for example, a set member of the other data item, according to the unidirectional signal flow direction.

Preferably, each controllable interconnect means is operable in any one of a plurality of states, which states are equal in number to the different associations which are possible between two data items, and the status of each said interconnect means is controlled by a multistate control device having an equal number of alternative states, said control device forming part of a conventional computer memory and being individually addressable therein by operator action in order to establish the control device in a desired state and, accordingly, to establish the interconnect means in the corresponding state. Conveniently each interconnect means is 4 state, and each control device is formed by a pair of bistate memory elements in a conventional random access memory (RAM).

Alternatively, each controllable interconnect means is operable in any one of a plurality of states, which states are less in number than the different associations which are possible between two data items and the status of each said interconnect means is controlled by a multi-state control device having an equal number of alternative states to those of the interconnect means, said control device forming part of a conventional computer memory and being individually addressable therein by operator action in order to establish the control device in a desired state and, accordingly, to establish the interconnect means in a corresponding state, the associations between two data items which are unobtainable by operation of the interconnect means being provided by software control of the data items. Conveniently, there are four different possible associations of which the association of 'identity' or 'synonymous' or 'alias' is provided by software control of the data items and the remaining three associations are provided by a 3 state interconnect means actuated by a known 3-state memory element of a random access memory (RAM).

In a preferred embodiment, the computer memory device according to the present invention comprises pathways in the form of electrical signal conductors, the controllable interconnect means comprises switched diodes, and control of the interconnect mean is effected by the memory elements of a conventional RAM which are linked by status control channels to the interconnect means. The status control channels, for example, may simply be wired connections or may be supportive of electrical-charge coupling, optical coupling or electron-beam coupling.

Embodiments of the present invention will now be described by way of example with reference to the accompanying drawings, in which:

FIG. 1 illustrates a data collection and the associations between data items of the collection;

FIG. 2 schematically illustrates a preferred form of computer memory device according to the present invention in association with peripheral components which operate the device;

FIGS. 3A-3C illustrate alternative forms of a detail of the device of FIG. 2;

FIG. 4 schematically illustrates a detail of the FIG. 2 device dedicated to a particular use;

Figure 2:
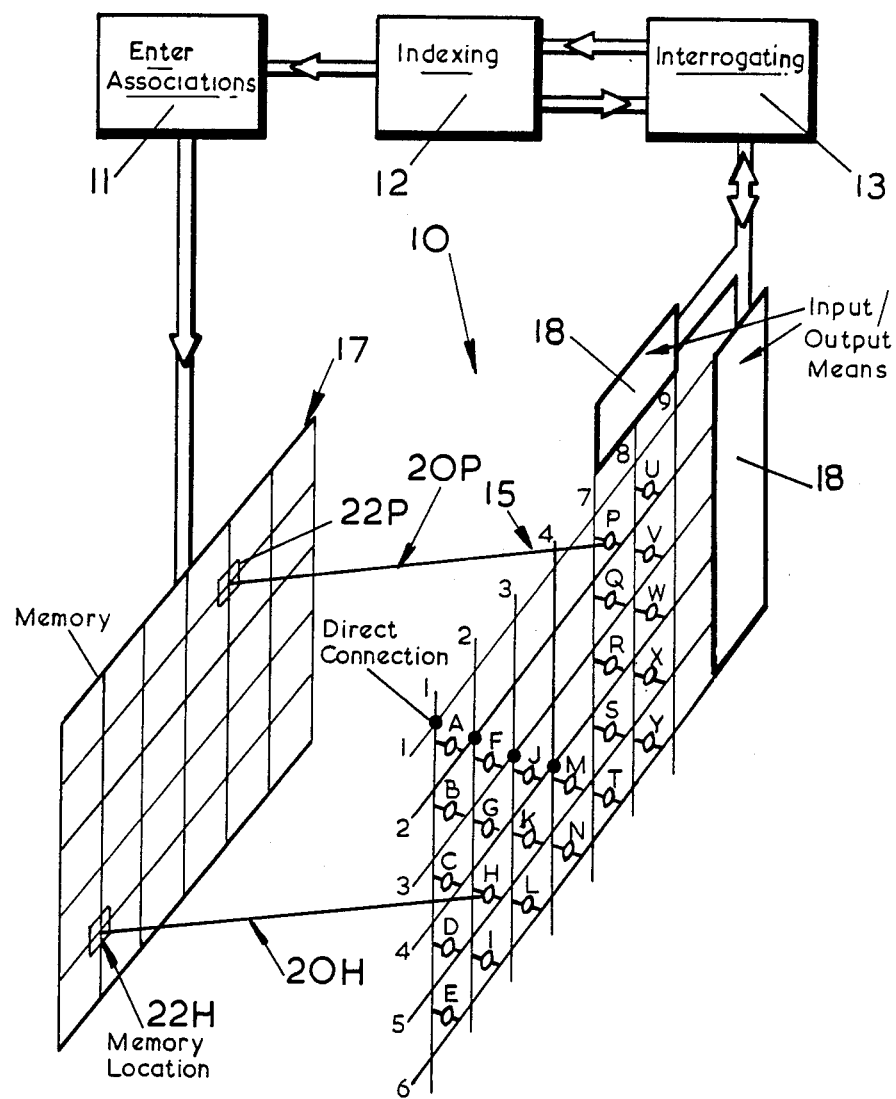

As is shown in FIG. 2, the memory device 10 is associated with component 11 which permits identified associations to be entered, component 12 which establishes an index of data items correlated with the pathways of the device 10, and an interrogation component 13 whereby the device 10 may be provided with input signals, and output signals may be extracted from device 10.

Device 10 comprises an array 15 of unique conductors numbered 1–9 the geometry of which need not be as illustrated in FIG. 2, it being understood that the FIG. 2 geometry is provided merely to permit clarity of explanation. Thus, in FIG. 2, conductors 1 to 4 are each of cruciform shape, in effect being individually formed by orthogonal sub-conductors which are directly connected at the cross-over. Conductors 5 to 9 are linear. The conductors 1–9 are associated with controllable interconnect means respectively identified by the letters A-N and P-Y (there is no '0' in the interests of clarity), so that, for example, conductor 1 is directly linkable to:

conductor 2 by interconnect means A;
conductor 3 by interconnect means B;
conductor 4 by interconnect means C;
conductor 5 by interconnect means D;
conductor 6 by interconnect means E;

and conductor 2 is directly linkable to:

conductor 1 by interconnect means A;
conductor 3 by interconnect means F;
conductor 4 by interconnect means G;
conductor 5 by interconnect means H;
conductor 6 by interconnect means I;
conductor 7 by interconnect means P;
conductor 8 by interconnect means U;

The individual interconnect means A-Y are controllable by signals delivered over respective status channels 20A, 20B ... 20Y (only some of which are shown in the interests of clarity) from respective control devices 22A, 22B ... 22Y, which form part of a memory 17 which is addressable by component 11. Input signals are delivered to the conductors 1–9 of the array 15 by an input/output means 18 which is under the control of component 13. Output signals from the array 15 are received by the means 18 and delivered to component 13.

Figure 3:
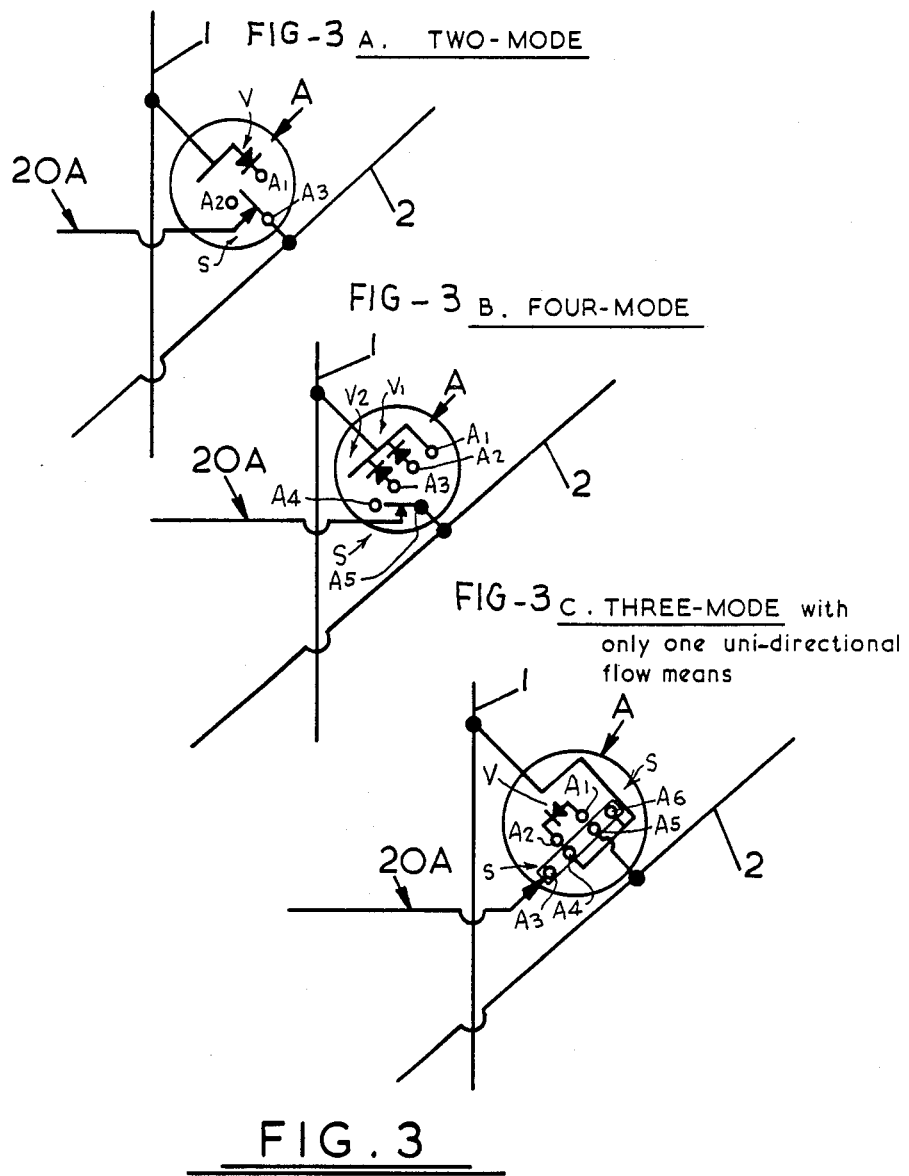

FIGS. 3A-3C illustrate 3 possible implementations of a controllable interconnect means. The possible implementation of the controlled interconnect means shown in FIGS. 3A through 3C are presented in schematic form and therefore are described with reference to a diode and a multi-position switch. As is clear from an examination of the specification, the switches shown in FIGS. 3A through 3C schematically represent electronic switches. Thus in FIG. 3A conductors 1 and 2 are linkable by interconnect means A which has three terminals $A_1$, $A_2$ and $A_3$ and connected between a diode conductor 1 and terminal $A_1$, and a two-position reed switches coupled via terminal $A_3$; such that, depending on the position of the switch means A in engaging terminal $A_1$ or $A_2$; either effects a disconnection between conductors 1 and 2 or an interconnection with unidirectional current flow through the diode having five terminals $A_1 \ldots$ to $A_5$ from conductor 1 to conductor 2.

In FIG. 3B the means A is four-mode having five terminals $A_1$–$A_5$, and comprises a four-position reed switches coupled via terminal $A_5$ to conductor 2 the first switch terminal $A_1$ being directly coupled to conductor 1, and the second $A_2$ and third $A_3$ switch terminals being respectively coupled to conductor 1 via reverse poled diodes $V_1$, $V_2$. The fourth switch terminal $A_4$ is not connected to conductor 1. Accordingly, depending upon the position of the switches S, the FIG. 3B means A effects a disconnection between conductors 1 and 2 (at the fourth switch terminal $A_4$), a bidirectional connection between conductors 1 and 2 (at the first switch terminal $A_1$), a unidirectional interconnection between conductors 1 and 2 with current flow from conductor 1 to conductor 2 (at the second switch terminal $A_2$) or a unidirectional interconnection between conductors 1 and 2 with current flow from conductor 2 to conductor 1 (at the third switch terminal $A_3$).

In FIG. 3C the means A is three-mode, incorporating a three position slide switch S and a single diode V. The slide switch S has a pair of fixed terminals $A_1$, $A_2$ between which the diode V is connected and a row of four movable terminals $A_3$, $A_4$, $A_5$ and $A_6$ movable by virtue of these terminals being carried by a slide element $S^1$, the first movable terminal $A_3$ is not connected to anything, the second $A_4$ and fourth $A_6$ movable terminals are directly connected to conductor 1, and the third movable terminal $A_5$ is directly connected to conductor 2. When the slide element $S^1$ is moved the fixed terminals $A_1$, $A_2$ of the switch (between which the diode V is connected) mate with the first and second movable terminals $A_3$, $A_4$, or with the second and third movable terminals, $A_4$, $A_5$, or with the third and fourth movable terminals $A_5$, $A_6$. Accordingly, depending upon the position of the switch, the FIG. 3C means A effects a disconnection between conductors 1 and 2 (at the first and second movable switch terminals $A_3$, $A_4$), or a unidirectional interconnection between conductors 1 and 2 with current flow from conductor 2 to conductor 1 (at the second and third movable switch terminals $A_4$, $A_5$), or a unidirectional interconnection between conductors 1 and 2 with current from conductor 1 to conductor 2 (at the third and fourth movable switch terminals $A_5$, $A_6$). In each of FIGS. 3A, 3B and 3C the switch requires to be actuated to take up only one of its possible positions and this is effected by the previously described signals delivered over channel 20A from the control device 22A. As has been explained, because FIG. 3A implementation is two-mode control device 22A need only be two-mode (that is, the control signal delivered over channel 20A need only be binary in nature) and can therefore be implemented by a single memory location in a conventional RAM 17. Because the FIG. 3B implementation is four-mode, control device 22A may be implemented by a pair of memory locations in a conventional RAM 17, and likewise for the three-mode FIG. 3C implementation (in which case one mode, that is one binary state, of one memory location is redundant). Alternatively, for FIG. 3C, device 22A may be implemented by a single memory location in a conventional tri-state memory. It will be understood that bidirectional control of flow between the FIG. 3C conductors is obtainable and if the corresponding association between the data items represented by conductors 1 and 2 in FIG. 3C is required this may be implemented by the indexing component 12.

Figure 1:
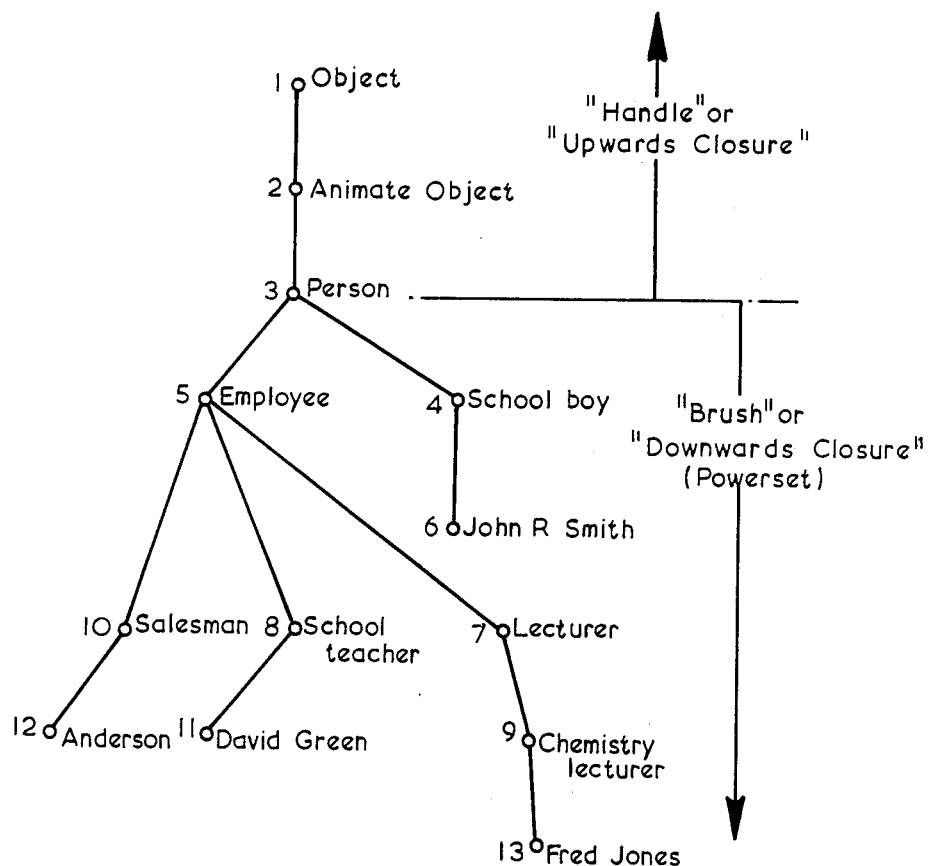

The method of operation of the device 10 will now be described with respect to the FIG. 1 data collection which, because it has thirteen data items, is implemented conveniently in a 13×13 array of sub conductors forming 13 conductors each of the cruciform type. The items of the collection are entered into the indexing component 12 (FIG. 2) and allocated conductor numbers as identified in FIG. 1. The nature of each association between data items is then entered into component 11 which then loads the pertaining memory locations of memory 17 to the required state. For example, 'Animate Object' (number 2) is a sub-set of 'Object' (number 1) so that device 22A of memory 17 is loaded to set controllable interconnect means A whereby signal current applied to conductor 1 will flow to conductor 2. This loading of the memory 17 is effected until all associations have been entered and the conductor array 15 has the form shown in FIG. 4. In detail, the interconnect means linking conductors 1 to 2; 2 to 3; 3 to 4; 3 to 5; 4 to 6; 5 to 7; 5 to 8; 5 to 10; 7 to 9; 8 to 11; 9 to 13; and 10 to 12, are each set to interconnect the pair of conductors with unidirectional current flow from the first identified conductor to the second identified conductor. All other interconnect means are set to the disconnected state. The selection of direction of the unidirectional current flow between conductors is based upon the premise that a positive potential is applied as a signal input to provide a 'downwards closure' on a selected data item of the collection, whereas a negative potential is applied as a signal input to provide an 'upwards closure'.

By way of example, if the operators query is to find the Downwards Closure (or Brush) of 'Employee', the interrogation component 13 (FIG. 2) applies a positive voltage signal to conductor 5, and the resulting output signals are established on conductors 5, 7, 8, 9, 10, 11, 12 and 13. These output signals are identified by component 13 which, in conjunction with indexing component 12, delivers to the operator the answer 'Employee', 'Lecturer', 'school teacher', 'chemistry lecturer', 'salesman', 'David Green', 'Anderson' and 'Fred Jones'. Likewise, if the operator's query is to find the Upwards Closure (or Handle) of 'Employee', the interrogation component 13 applies a negative voltage signal to conductor 5, and the resulting output signals are established on conductors 5, 3, 2, 1 which are identified to the operator as 'Employee', 'Person', 'Animate Object', 'Object'.

By way of further example, if the operator's query is to identify all data items in the Downward Closures (or Brushes) of the two terms 'Employee' and 'schoolboy', this would be established by interrogation component 13 simultaneously establishing positive voltage signals on conductors 4 and 5 which would result in positive output signals appearing on conductors 4, 5, 6, 7, 8, 9, 10, 11, 12 and 13.

For queries involving the union of a Handle and a Brush, simultaneous application of positive and negative potentials is not possible, since this may result in the connection of a positive potential to a negative potential. However, such queries may be answered by the interrogation component 13 which, firstly, causes to be applied only the potential of the polarity corresponding to Handle or Brush, and identifies the conductors on which the same potential polarity is sensed, and, subsequently, causes application only of the potential of the other polarity, corresponding to Brush or Handle, and identifies the conductors on which that other potential polarity is sensed, the two lists of identified conductors being combined by the component 13 to provide the answer to the query.

In order to deal with queries involving intersections of Handles and/or Brushes, this can be done in a manner analogous to the answering of queries concerning union of a Handle and a Brush, whereby the interrogating component 13 compiles separate lists of relevant Handles and/or Brushes by sequential answering of appropriate sub-queries, and then makes comparison of these lists and selects those identified conductors which are common to the lists, and answers the original query as the corresponding items.

It will be appreciated from the foregoing that the device 10 is extremely powerful in that its speed of response to a query is very fast compared with prior art arrangements and it is sufficiently flexible to be able to answer complex queries of Boolean type—e.g. unions and intersections.

Since it is generally accepted that practically all data collections incorporate a significant number of data items with no mutual association it may be possible, as is exemplified by the FIG. 2 device, to provide some signal pathways which do not have an interconnect means with a number of the other signal pathways.

Figure 5:
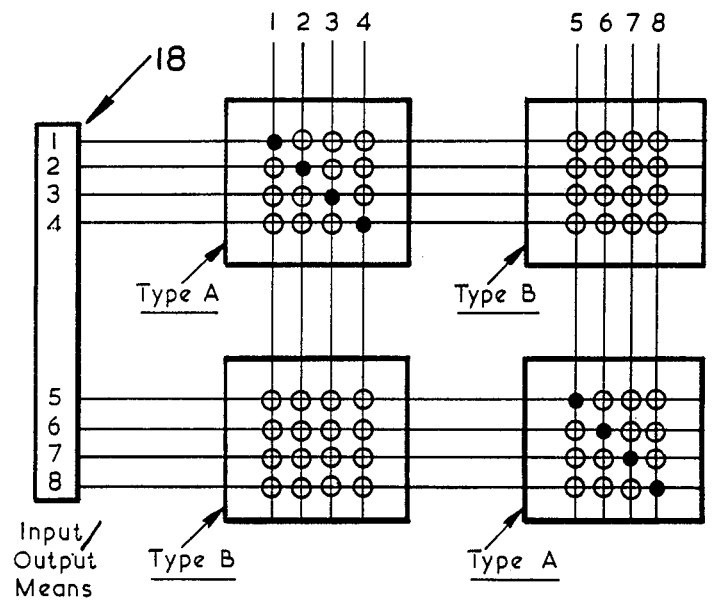
FIG. 5 illustrates a different implementation of computer memory device according to the present invention.

Also, large capacity memory devices in accordance with the present invention may, conveniently, be constructed as a combination of several smaller capacity memory devices, and one example of this is illustrated in FIG. 5. In FIG. 5 there are two type A devices, each having four conductors in cruciform, and two type B devices, each having eight conductors which are linear.

Figure 6:
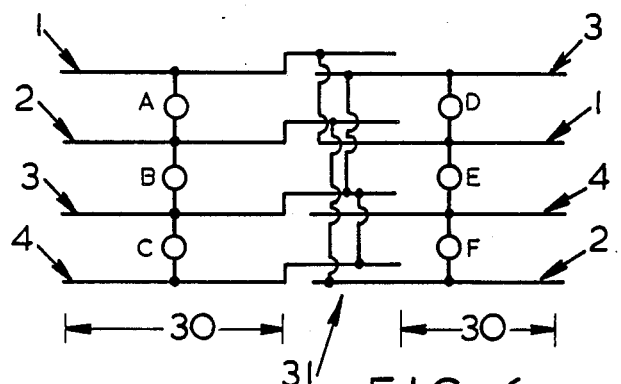
FIG. 6 illustrates a preferred form of a detail of a computer memory device according to the present invention.

FIG. 6 illustrates a preferred geometry of a small conductor array of the device 10 according to the present invention and which, when expanded to a multitude of conductors, is suitable for very large scale integrated construction. In this device, the individual conductors 1–4 are arranged in fields 30, and at the edge of each field 30 the numerical order of the conductors is made different by cross-connecting conductors 31. Any one conductor is linkable to any other conductor by the aforesaid interconnect means A, B, C, etc., which are located within the appropriate fields 30.

Figure 7:
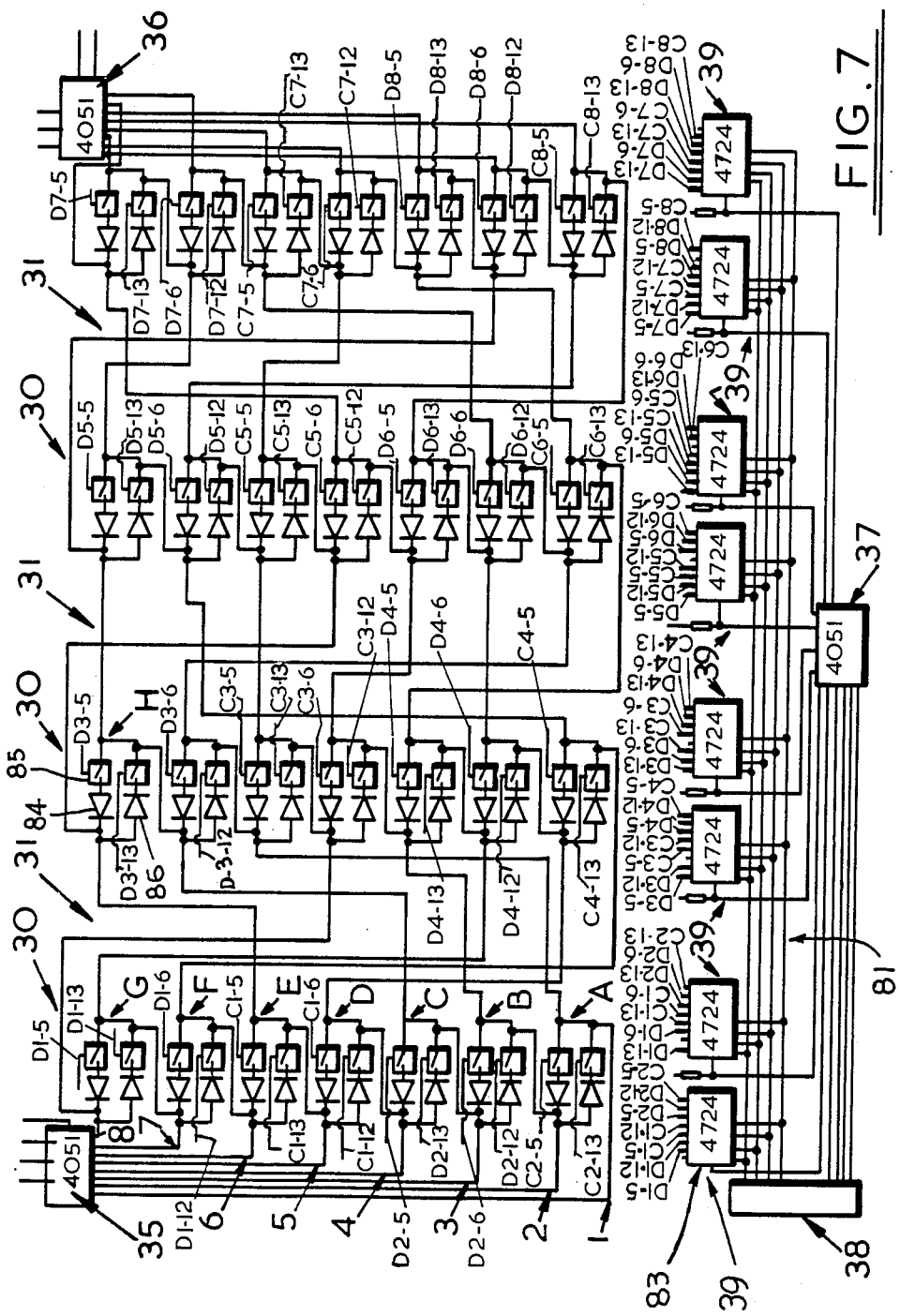
FIG. 7 illustrates the FIG. 6 detail in a practical computer memory device according to the present invention.

A practical format of the FIG. 6 arrangement is illustrated in the device 10 of FIG. 7, where the input/output means 18 of FIG. 2 is replaced by input device 35 and output device 36, the entering component 11 is formed by component 37, and driver component 38, the memory 17 is formed by individual memory components 39, the signal pathway conductors are identified as 1, 2, 3, . . . 8, and the interconnect means A, B, C, . . . etc. are individually identified in part only in the interests of clarity. (It will be recognised that the mutual connection of specific conductors by specific interconnect means in the FIG. 7 arrangement may not correspond numerically and alphabetically to that of FIG. 2).

Although each interconnect means has been functionally described as being multi-mode, it will be evident that each means may be implemented as a collection of single mode devices.

With continued reference to FIG. 7, input device 37 passes signals to driver 38 which in turn presents binary signals along address bus 81 in order to address and set selected memory locations in memory 39. The output lines of memory 39 form output bus 83 and depending on which of the memory cells have been addressed, output signals appear on the selected output lines. As can be seen in FIG. 7, each of the blocks constituting the memory 39 has 8 outputs of which 7 are connected to various of the interconnect means of which only A through H are labelled. Components 37, 38 and 39 together form a Random Access Memory.

Each of the interconnect means contains the same components. Using interconnect means H as an example, the interconnect means is made up of a diode 84 with its anode being connected to one end of an on-off switch 85, which is implemented as a controllable switch having a control line D3-5. The cathode of diode 84 is connected to the anode of diode 86, which in turn has its cathode connected to one end of a controllable switch 87. The other ends of switches 85 and 87 are connected to each other. In FIG. 7, interconnect means H is connected to lines or signal flow pathways 5 and 3.

Input device 35 contains 8 input lines numbered 1 through 8. Output device 36 likewise contains 8 output lines numbered 1 through 8. Lines 1–8 represent conductors in the same way as that previously described with regard to FIG. 2. Thus, each pair of the lines is linkable by an interconnect means. Further, by tracing each of the input lines 1–8 to the output lines 1–8, it immediately becomes apparent that there is a direct connection between input line 1 and output line 1, input line 2 and output line 2, and so forth for all 8 input and output lines. Regarding the remaining types of connection between the input-output lines, it is clear from FIG. 7 that they may all be interrelated to each other in any fashion in accordance with a previously determined relationship of the type shown in FIG. 1 for a very simple data collection. Thus, conductor 1 may be related to conductor 2 through interconnect means A. Further, upon activation of the switches found in interconnect means A through the output of memory cells connected by wires C2-5 and C2-13 from memory 39, it is possible to create a relationship between conductor 1 and conductor 2 as an open circuit, as a unidirectional connection in either of two directions based on the orientation of the diodes or as a bidirectional connection.

The present invention provides numerous advantages over the prior art some of which have been previously explained. Additionally, however, an important advantage of the device, when implemented in VLSI technology and RAM memory, is that a localised malfunction does not necessarily lead to inoperability of the entire device because, following diagnosis of the malfunction location, the required function can be transferred to another location of the array by suitable instruction to the indexing component 12 and re-entering the relevant associations via the entering component 11.

In considering known data collections it has been established that not every data item is associated with every other data item. Initially, as the data collection is amassed, there may be relatively few associations between data items, but these associations will grow in number as the data collection becomes enlarged. There is therefore a need to combine a number of memory devices 10 in accordance with the present invention which will enable more and more of these devices 10 to be used as the data collection enlarges. FIG. 5 illustrates one such form of combining the devices 10, but it may be wasteful of memory capacity in that it is capable of interconnecting every conductor with every other conductor. The format of the FIG. 2 memory device may also be used for capacity enlargement in that conductors 7 and 8 in FIG. 2 may be interconnected by dedicated use of conductor 5, but this arrangement is also wasteful of capacity in that conductor 5 becomes unavailable for the purposes of representing a data item.

Figure 8:
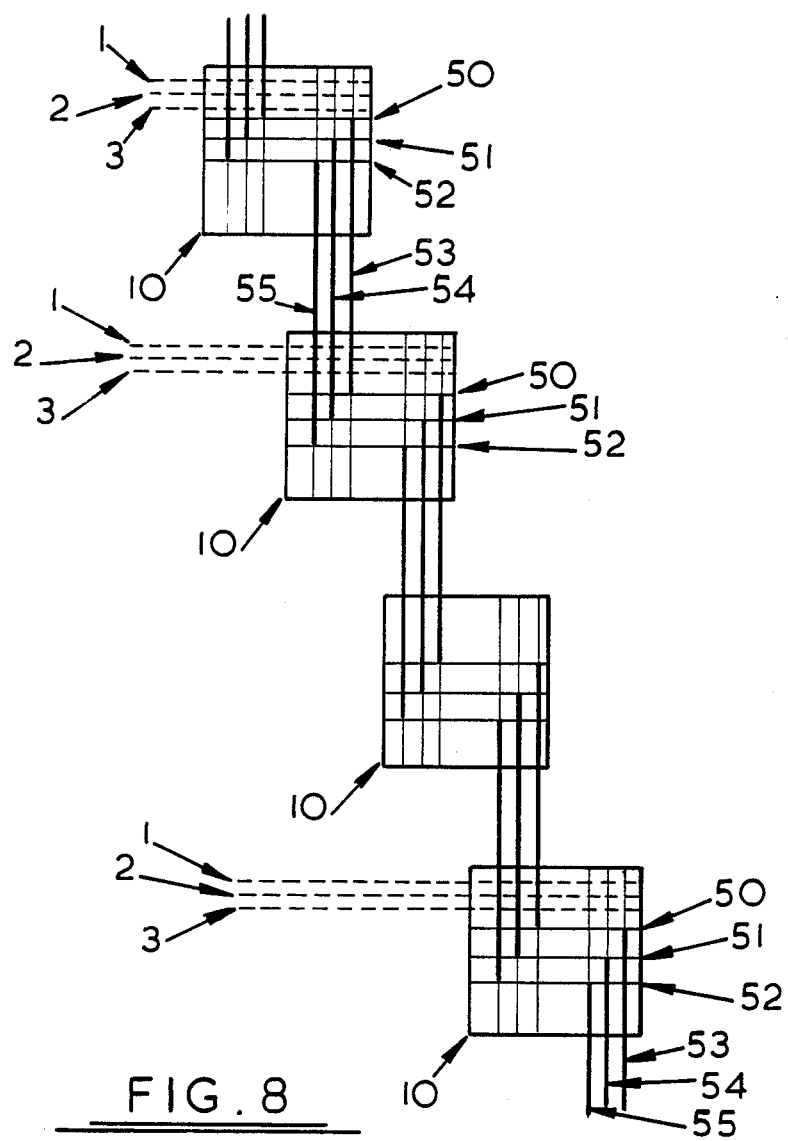
FIG. 8 illustrates an arrangement of interconnecting a plurality of computer memory devices according to the present invention in order to increase storage capacity.

The arrangement of FIG. 8 illustrates a practical way of interconnecting several devices 10 which is achieved by providing in each device 10 a series of designated conductors 50, 51, 52 which are switchably connected to conductors 53, 54, 55, respectively to provide a so-called "daisy chain". The conductors 1, 2, 3, etc. within each device 10 which are capable of representing data items as previously discussed are connected to the designated conductors 50, 51, 52 by means of controllable interconnect means as previously discussed. It will be appreciated that, although, any signal pathway conductor 1,2,3 etc. may be connected to any other when the data collection is entered, the FIG. 8 arrangement is such that some entered associations will prevent the subsequent entry of other associations because the individual devices 10 are connected serially, and, therefore, an interconnection between, for example, a signal pathway conductor in a first device 10 and a signal pathway conductor in a last device 10 uses up conductors within each of the intervening devices 10 in the daisy chain.

Figure 9:
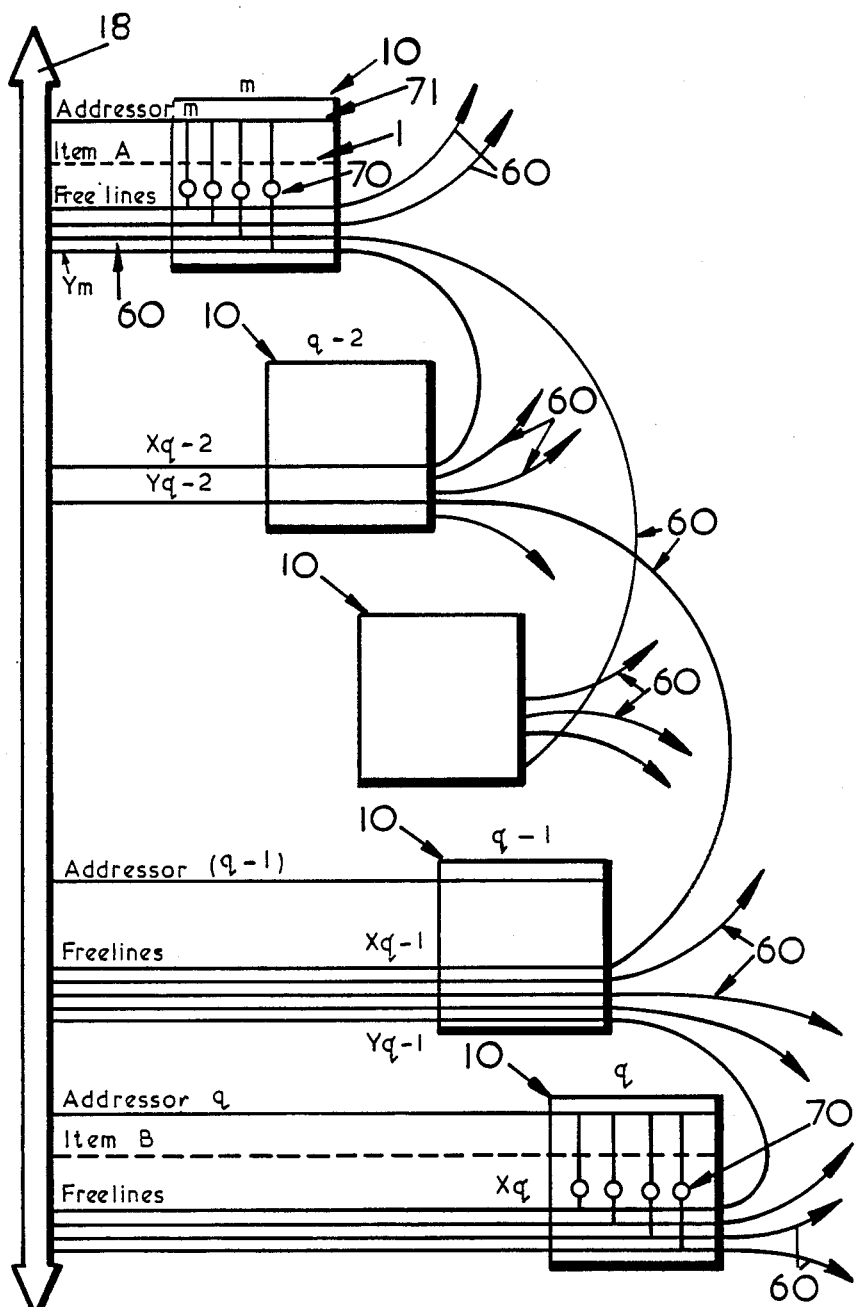
FIG. 9 illustrates a preferred interconnection arrangement of a plurality of computer memory devices according to the present invention in order to increase storage capacity.

FIG. 9 illustrates the preferred arrangement for interconnecting a number of devices 10. In FIG. 9 each device 10 has a number of its conductors designated 'free line' conductors 60, these being externally connected with only one 'free line' conductor 60 of another device 10. The distribution of these connections between devices 10 is random, and selection of the random distribution is determined at the manufacturing stage in accordance with known distribution theories. In each device 10 each free line 60 is connectable by an interconnect means 70 with a dedicated addressor conductor 71, and each free line 60 is connectable to each other within the same device 10 by the interconnect means previously described, because each free line 60 and the addressor conductor 71 is one of the signal pathway conductors 1, 2, 3, etc. previously discussed. Only one other such conductor is illustrated in the device 10m of FIG. 9 in the interests of clarity. Initially, the free lines 60 are bidirectionally connected to each other and to the addressor conductor 71 in respective devices 10.

In the FIG. 9 arrangement each interconnect means incorporates a voltage drop device providing a preset level of voltage drop when an electrical signal is transmitted therethrough, either bidirectionally or unidirectionally. This voltage drop is conveniently provided by a single diode which, for example, provides a 0.6 volts drop.

By way of example of the operation of the FIG. 9 arrangement, if it is desired to represent an association between two data items respectively represented by the conductors designated item A and item B which are in devices 10m and 10q a voltage of predetermined level is established on addressor line m whilst the voltage level of addressor line q is monitored. The voltage level is initially set slightly larger than twice but less than three times the voltage drop of a single diode and is referred to as a "brush level 2" operation. If no direct connection exists between device 10m and device 10q then no voltage will be sensed on addressor line q. If an avilable direct connection exists then a small voltage will be sensed on addressor line q (being the applied voltage level minus the voltage drop of a single interconnect means 70 in device 10m minus the voltage drop of a single interconnect means 70 in device 10q). Having thus determined the presence of at least one available direct connection between devices 10m and 10q it is necessary to identify which of the free lines 60 in device 10m, and which of the free lines 60 in device 10q, provide one such path; to disconnect the identified free lines from the pertaining addressor line m,q and from the other free lines by means of the pertaining interconnect means 70 and to connect the item A line to the relevant free line 60 in device 10m, and the item B line in device 10q to the relevant free line 60 in device 10q.

This identification is achieved by applying to addressor line m a brush level 1 voltage (i.e. a voltage slightly greater than a single diode voltage drop but less than the voltage drop of two diodes) and, by monitoring each of the conductors in device 10q, there are identified the free lines 60 in device 10q which are connected directly with device 10m. One such free line 60 in device 10q is selected. A brush level 0 voltage (i.e. less than one diode voltage drop) is then applied to the selected free line 60 in device 10q to identify the free line 60 in device 10m.

In general, it may be necessary to establish higher brush level voltages on addressor line m in order to identify a signal pathway to addressor line q if there is an indirect available connection between two of the free lines 60 in devices 10m and 10q. By indirect we mean that the applied signal is transmitted through one or more intervening devices 10, such as device 10 (q-2) and device 10 (q-1), prior to reaching device 10q, in each of which intervening devices 10 there will be further diode voltage drops. Accordingly, unit steps of brush voltage level are applied up to a maximum relevant brush level. This establishes the minimum number of intervening devices 10 involved in routing the required association between devices 10m and 10q.

If routes are established at a brush voltage level n, then, an actual route is identified by applying a brush voltage level of (n-1) on addressor line m and noting the identity of the free lines 60 in device 10q on which a voltage is sensed. One of these free lines 60 in device 10q is selected as, say, Xq, and is disconnected from the addressor line q and form the other free lines 60 in device 10q. A brush voltage level zero is then applied to line Xq which accordingly indicates in a device 10, denoted device 10 (q-1), the directly connected free line 60 which is denoted line Y(q-1), and this is then disconnected from addressor line (q-1) and from the other free lines 60 in device 10 (q-1). A brush voltage level (n-2) is then applied to addressor line m and the resulting free lines 60 in device 10(q-1) identified. One is denoted X(q-1) and this is disconnected from addressor line (q-1) and from the other free lines 60 in device 10(q-1) in the same manner as for line Xq, whereafter the corresponding procedure is repeated until Ym is identified and disconnected etc.

Finally, the interconnect means A,B,C, etc. between each line Xi and its corresponding line Yi is put in its bidirectional flow status, and the conductor corresponding to item A in device 10m is connected to the line Ym in device 10m whilst the conductor corresponding to item B in device 10q is connected to the line Xq in device 10q, one of these two latter connections being effected to represent the desired nature of the association between items A and B and the other connection permitting signal flow at least in the same direction. Of course, alternative combinations of the statuses of the interconnect means A,B,C, etc. could be used to provide the required association.

It will be appreciated from the foregoing that in the FIG. 9 arrangement once any two free lines 60 have been interconnected in order to establish the desired association between two items of the data collection, these free lines 60 are no longer connected to the relevant addressor line nor to any of the remaining free lines 60 within the relevant device 10 and therefore cease to be 'free lines'. Furthermore, the identified procedure in the FIG. 9 arrangement utilises the unique inherent properties of each device 10 and enables rapid interrogation of the entire memory to identify all currently available routes for establishing associations between data items.

It will be understood that the identified procedure involves providing the intersection of various sets of identified conductors and only one method of achieving this has been described in detail. However, there are a number of alternative methods of solving this problem using a brush or handle voltage level technique.

Ultimately, with the foregoing procedure in the FIG. 9 arrangement, a situation may be reached where a realisable route between two particular devices 10 no longer exists. This does not imply that the complete memory is saturated because there may be numerous other realisable routes if one of the end point devices 10 is altered. This, of course, can be done by way of the indexing component 12, to establish, for example, item A on conductor 3 of device 10 (q-2) as well as on conductor 1 of device 10m. It would then be necessary to identify, if possible, a route between device 10 (q-2) and device 10q. Conductor 1 in device 10m would then be indexed as an alias of conductor 3 in device 10 (q-2) in the indexing component 12.

The arrangement described in FIG. 9, together with the method of operation thereof, rapidly establishes the functionally shortest available route between any two of the devices 10, which is a particular advantage for handling very large data collections.

The interrogation component 13 may take conventional form, and may include means to provide time-dependent potentials, for example a series of pulses to be applied, and to command accordingly, and means to accept and hold time-dependent potentials, for example pulse-counters, and to interpret these.

What is claimed is:

1. A computer memory device for storing identified associations between data items of a data collection, said device comprising an array of signal-flow pathways, which pathways are respectively representative of data items of said data collection, interconnect means operable in any one of a plurality of states, and externally controllable as to which such state by an external control device, for selectively interconnecting said pathways in one or more pairs and effecting directional control of signal flow between each interconnected pair in accordance with the identified associations between the respectively represented data items of said data collection, and signal input/outputs means connected to said array for delivering an input signal to a selected pathway representative of a selected data item and for receiving output signals from the selected pathway and from the pathways interconnected therewith and representative of the selected data item and the data items of said data collection which have identified associations with said selected data item.

2. A device as claimed in claim 1 wherein each signal pathway of said array is interconnectable with each other pathway therein by means of a said controllable interconnect means.

3. A device as claimed in claim 1 wherein each controllable interconnect means is operable selectively to effect control of signal flow between interconnected pathways in any one of the following states, namely, unidirectionally in either one of two opposed directions, bidirectionally, and inhibit (disconnect).

4. A device as claimed in claim 1 wherein each controllable interconnect means is operable in any one of a plurality of states which states are equal in number to the different associations which are possible between two data items and the status of each said interconnect means is controlled by a multistate control device having the same number of alternative states as said plurality of states, said control device forming part of a conventional computer memory and being individually addressable therein by operator action in order to establish the control device in a desired state and accordingly to establish the interconnect means in the corresponding state.

5. A device as claimed in claim 4 wherein each interconnect means has four states and each control device is formed by a pair of bi-state memory elements in a conventional random access memory (RAM).

6. An associate memory comprising a plurality of memory devices each as claimed in claim 1 and wherein each device has at least one of its signal pathways externally directly connected to a signal pathway in another of said memory devices.

7. A memory as claimed in claim 6 wherein each interconnect means includes a signal level attenuator element, the quantum of attenuation being the same for each interconnect means in each of the computer memory devices of the memory.

* * * * *